United States Patent [19]

Grau et al.

[11] 4,225,819

[45] Sep. 30, 1980

[54] CIRCUIT BOARD CONTACT CONTAMINATION PROBE

[75] Inventors: Thomas G. Grau, Mendham Township, Morris County; David E. Tompsett, Chatham Township, Morris County, both of N.J.

[73] Assignee: Bell Telephone Laboratories, Incorporated, Murray Hill, N.J.

[21] Appl. No.: 950,725

[22] Filed: Oct. 12, 1978

[51] Int. Cl.³ ............................................ G01R 31/02
[52] U.S. Cl. ................................ 324/415; 324/152 F; 324/73 PC
[58] Field of Search ............... 324/72.5, 158 F, 158 P, 324/73 R, 73 PC

[56] References Cited

U.S. PATENT DOCUMENTS

| | | | |
|---|---|---|---|
| 2,918,648 | 12/1959 | Ludman et al. | 324/73 PC |
| 3,458,807 | 7/1969 | Smith | 324/158 F |
| 3,970,934 | 7/1976 | Aksu | 324/158 F |

Primary Examiner—Michael J. Tokar
Attorney, Agent, or Firm—Dwight A. Marshall

[57] ABSTRACT

Apparatus for detecting the presence of contamination films and foreign material on the conducting fingers of a circuit board. The apparatus includes a guide block assembly (11) designed to receive and momentarily hold a circuit board (100) and a spring biased hold down bar (25) for securely holding the circuit board in the guide block assembly. The apparatus further includes apparatus (23, 31) for use in positioning a plurality of probe assemblies (33) to simultaneously engage a pair of electrodes (330) with each one of the circuit board conducting fingers (101). A controller (43) enables switch apparatus (42) to selectively connect each pair of electrodes with electrical resistance measuring apparatus (50) to measure the resistance of any contamination film and foreign material appearing on a circuit board conducting finger between the electrodes of each electrode pair.

17 Claims, 5 Drawing Figures

CIRCUIT BOARD CONTACT CONTAMINATION PROBE

TECHNICAL FIELD

This invention relates to apparatus for use in detecting contact contamination. In particular, it relates to apparatus for use in detecting and measuring contamination films and foreign material that occur on the contact conducting fingers of a printed wiring circuit board.

BACKGROUND ART

Printed wiring circuit boards, sometimes referred to simply as circuit boards, have a widespread use in electrical circuit apparatus manufactured by electrical and communications industries. Typically, circuit components are mounted on a circuit board and circuit patterns fabricated on the board interconnect the components to form a composite electrical circuit. The circuit patterns are extended to a plurality of contact or conducting fingers formed adjacent one edge of the board that are used with plug-in types of connectors to interconnect a number of circuit boards and thereby form a larger composite electrical circuit.

Sometimes when an electrical circuit on a circuit board is connected through a plug-in connector to other circuit boards, the circuit fails to operate. The operational failure may result from a circuit fault or, as sometimes happens, from a poor connection or no connection at all between the circuit board conducting fingers and the contacts of a connector. This latter type of failure may arise either because some particulate matter or a film formation has appeared on the surfaces of the circuit board conducting fingers so that the conducting fingers fail to make electrical connection with the connector contacts. In many instances particulate matter or a contamination film formation inadvertently appears on the conducting fingers of a circuit board while the circuit board is being manufactured or repaired. Subsequently, the newly manufactured or repaired circuit board may be shipped to another location and installed into connector apparatus to form a composite electrical circuit. Often times the electrical circuit fails to operate in that particulate or foreign matter and contamination film appearing on the installed circuit board conducting fingers result in a poor or open connection. Locating these types of circuit failures is extremely difficult.

Measurement techniques for measuring resistance of conductive elements have been disclosed in the prior art as evidenced by U.S. Pat. No. 3,974,443. These measurement techniques, sometimes referred to as a so-called four-point contact resistant measurement, are accomplished by applying a known constant current to two outer points of a conductive element and measuring the voltage appearing between two inner points of the same contact area. A problem with the apparatus used to make a four-point conductor element resistant measurement is that the prior art apparatus, as illustrated by U.S. Pat. No. 3,996,514, is bulky in size and requires that sufficient space be available in order to gain access to the measurement points. The aforementioned problem is highlighted with the prior art measuring apparatus as disclosed by U.S. Pat. No. 3,335,365 in that the apparatus is used only to measure the resistivity of a conductive element and is not suitable for use during the process of manufacturing or repairing of circuit boards to quickly detect and measure foreign material and contamination films on the plurality of conducting fingers of a circuit board.

Accordingly, a need exists in the art for apparatus arranged to detect and measure foreign material and contamination films on a circuit board conducting finger. A need also exists for apparatus arranged for use during the process of manufacturing or repairing a circuit board to rapidly detect and measure foreign material and contamination films inadvertently occurring on ones of a plurality of conducting fingers of a circuit board.

SUMMARY OF THE INVENTION

The foregoing problem is solved and a technical advance is achieved by circuit board testing apparatus arranged to couple electrical resistance measuring circuitry to a circuit board to detect and measure contamination appearing on the circuit board conducting fingers. The testing apparatus comprises guide apparatus for use in receiving and holding a circuit board and a probe assembly having a pair of electrodes corresponding to each of the circuit board conducting fingers.

Positioning apparatus is provided to secure the circuit board to the guide apparatus and to position the probe assembly to simultaneously engage each pair of electrodes with one of the circuit board conducting fingers. The testing apparatus also comprises coupling apparatus to sequentially connect each pair of engaged electrodes with the electrical resistance measuring circuitry to measure the resistance of a contamination film and foreign material appearing on a circuit board conducting finger between electrodes of the electrode pair.

In accordance with the invention, apparatus for testing circuit board conducting fingers comprises a plurality of probe assemblies each having a pair of electrodes positioned and mounted therein. Each electrode has a first, or needle, member with a land on one end for terminating a first conductor and an axial bore therein sized to receive a second conductor. Each electrode further comprises a second, or contact, member affixed to an end of the needle member opposite the land end for terminating the second conductor and for use in engaging a circuit board conducting finger. Each electrode also comprises a collar member affixed to the needle member for limiting movement of the electrode within a probe assembly and for use with a compliant spring member to position and bias the electrode contact member in engagement with a circuit board conducting finger along a centerline of the conducting finger.

Also in accordance with the invention, apparatus for testing a circuit board comprises positioning apparatus having resiliently biased apparatus for retaining and securing a circuit board to guide apparatus. The positioning apparatus also comprises carrier apparatus arranged to securely hold a plurality of probe assemblies and to move pairs of electrodes mounted in the probe assemblies into and out of engagement with conducting fingers of the circuit board. The positioning apparatus further comprises operating apparatus coupled to both the resiliently biased apparatus and to the carrier apparatus for enabling the resiliently biased apparatus to clamp the circuit board to the guide apparatus and for enabling the carrier apparatus to simultaneously move the electrode pairs into engagement with the circuit board conducting fingers.

Also in accordance with the invention, apparatus for testing circuit board conducting fingers comprises coupling apparatus for sequentially connecting pairs of electrodes each engaged with a circuit board conducting finger to electrical resistance measuring circuitry. The coupling apparatus comprises a controller and switch apparatus controlled by the controller to selectively couple a current supply and a voltage measuring device to pairs of terminals connected to electrode needle and contact members engaged with circuit board conducting fingers to determine the electrical resistance of contamination films and foreign material appearing on a conducting finger between electrodes of an electrode pair.

In further accordance with the invention, a method of testing a circuit board with testing apparatus comprises the steps of receiving and securing a circuit board to guide apparatus, positioning an electrode probe assembly with respect to the secured circuit board to simultaneously engage a pair of electrodes with each circuit board conducting finger, and selectively coupling electrical resistance measuring apparatus to each pair of the engaged electrodes to detect the presence of and measure contamination films and foreign material appearing on a circuit board conducting finger between the electrodes.

DESCRIPTION OF THE DRAWING

The foregoing as well as other objects, features and advantages of the invention will be more apparent from a description of the drawing in which.

DESCRIPTION OF THE INVENTION

1. Apparatus Description

Figure 1:
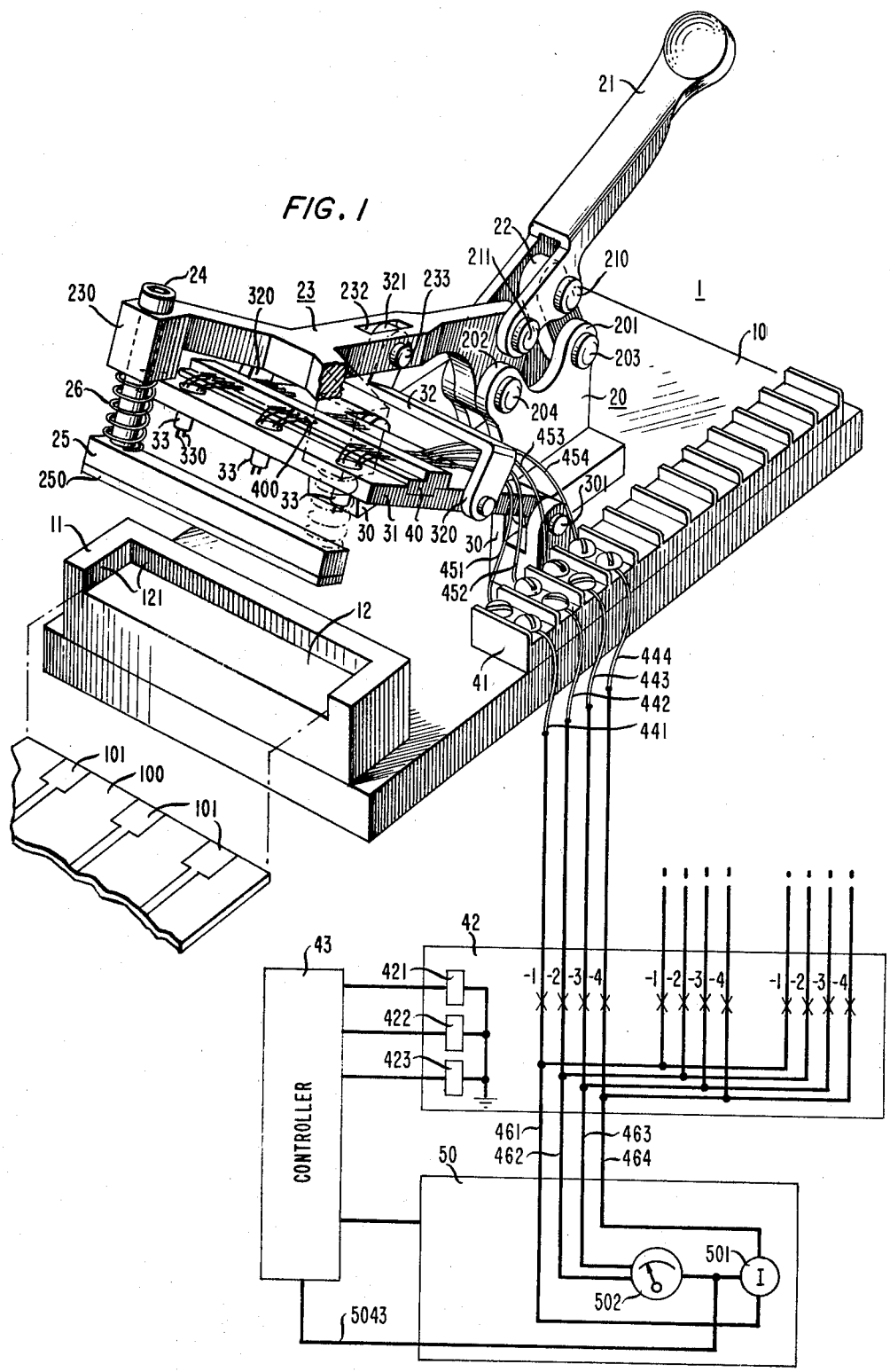
FIG. 1 is a prospective view showing exemplary circuit board testing apparatus embodying the principles of the instant invention.

Referring to the drawing and more specifically to FIG. 1 of the drawing, the circuit board testing apparatus 1 set forth therein is intended for use in the manufacture and repair of printed wiring circuit boards to test for contamination of the circuit conducting fingers. During the manufacturing process a circuit board 100 is examined by testing apparatus 1 by selectively coupling electrical resistance measuring apparatus 50 to one of the circuit board conducting fingers 101 in order to measure the electrical resistance of contamination films and foreign material that may inadvertently appear on a conducting finger.

Circuit board testing apparatus 1 comprises a base member 10 having a block assembly 11 located thereon that is arranged to receive a circuit board 100 and align each conducting finger 101 with respect to the testing apparatus. Block assembly 11 may be constructed with a nest 12 having side walls 121 that are intended to slidably receive and hold circuit board 100. In addition, block assembly 11 may also be formed with registration pins in the well-known manner that are located and positioned so as to be able to receive and hold circuit board 100 in a fixed relationship to test apparatus 1.

The testing apparatus base member 10 is arranged to support positioning apparatus which is provided to both secure circuit board 100 to block assembly 11 and to position a plurality of probe assemblies 33 to simultaneously engage a pair of electrodes 330 with each circuit board conducting finger 101. A mounting member 20 is affixed to base member 10 and is provided with a front clevis section 202 intended for receiving and rotatably mounting yoke member 23. Yoke member 23 is secured by pin member 204 to front clevis section 202 and is operated to clamp and secure circuit board 100 to block assembly 11. Each arm 230 and 231 of yoke 23 is drilled with a bolt receiving hole sized to slidably receive the shank portion of a bolt member 24 and to prevent passage of the bolt head.

Hold down bar 25 is used in combination with yoke member 23 to engage and retain circuit board 100 in nest 12 of block assembly 11. A nylon or other similarly constructed protector base 250 is affixed by recessed screws or other well-known means to the bottom surface of hold down bar 25 to protect circuit board 100 and prevent damage from occurring to the electrical circuitry utilized to interconnect conducting fingers 101 with other circuitry of circuit board 100. Spring members 26 are slidably placed over the shank portion of bolts 24 and hold down bar 25 is mounted on yoke member 23 by engaging bolts 24 with drill holes located on the upper surface of hold down bar 25.

The positioning apparatus also comprises carrier apparatus arranged to securely hold probe assemblies 33 and to move pairs of electrodes 330 mounted in each probe assembly 33 into and out of engagement with circuit board conducting fingers 101. A pair of clevis members 30 located on base member 10 is arranged to pivotally mount probe beam 31 by means of pin members 301. Probe beam 31 is supported and positioned with respect to yoke member 23 by means of a yoke link member 32 having leg sections 320 that are pivotally mounted on each side of probe beam 31 and having a center stem section 321 that is positioned within a slot 232 and pivotally attached by means of pin 233 to yoke member 23.

Figure 4:
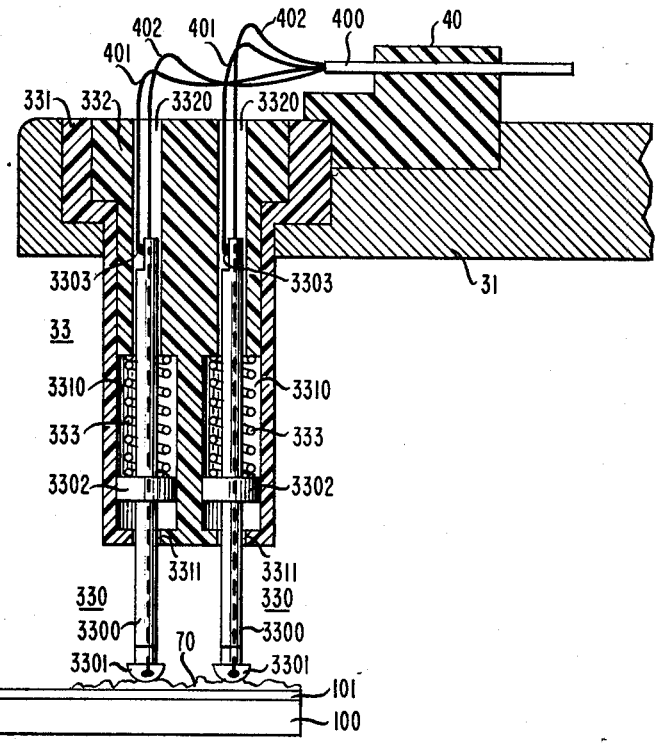
FIG. 4 is a fragmentary sectional view of the circuit board testing apparatus illustrating construction of a probe and electrode assembly used in testing a circuit board conducting finger.

A plurality of mounting receptacles are located on an end section of probe beam 31 and each is arranged to hold a probe assembly 33 in such a manner that a pair of electrodes 330 positioned within the probe assembly 33 may be aligned along a centerline of a corresponding circuit board conducting finger 101. Referring to FIG. 4 of the drawing, a probe assembly 33 is intended to carry a pair of electrodes 330 each of which comprises a needle member 3300, a contact member 3301 and a collar 3302. Needle member 3300 is typically a stainless steel hypodermic needle having an axial bore of approximately 0.023" (0.58 mm), an outside diameter of approximately 0.036" (0.9 mm) and a length of 0.2" (5.1 mm). One end of needle member 3300 has a land 3303 located thereon and the other end is affixed to a gold alloy contact member 3301 used to engage circuit board conducting finger 101. It is to be understood that contact member 3301 may be constructed of other conducting material such as copper plated with gold.

As assembled electrode 330 has an enameled conductor 402, typically of the order of 35 A.W.G. gage, extending through the axial bore of needle member 3300 and terminated with the gold alloy contact member 3301 affixed to the end of needle member 3300. Collar member 3301 having an outside diameter of approximately 0.055" (1.4 mm) is affixed to needle member 3300 and another conductor 401 is terminated to the needle member land section 3303.

A pair of assembled electrodes 330 are mounted in a first plug 331 positioned in one of the mounting receptacles of probe beam 31. Plug 331 is designed to have a first cavity section intended to receive a second plug 332 and to have a pair of axial aligned first and second bores 3310 and 3311 drilled along a diameter of and offset from the center of plug 331 to extend from the bottom of the cavity to the bottom surface of plug 331. Probe assembly 33 is assembled by slidably inserting the collar member 3302 of each of a pair of electrodes 330 into first bores 3310 so that the gold alloy contact members 3301 slidably extend through second bore 3311 and out beyond the bottom surface of plug 331. Compliant spring members 333 are placed in the first bores 3310 over the electrode needle members 3300 and a second plug 332 having a pair of bores 3320 axially aligned with first and second bores 3310, 3311 of first plug 331 is fitted into the cavity of first plug 331 over conductors 401, 402. Second plug 332 is positioned over the top of needle members 3300 so that the bottom surface of second plug 332 engages spring members 333 to maintain the pair of electrodes 330 in a fully extended position. Each probe assembly 33 is mounted in a mounting receptacle of probe beam 31 and aligned so that the pair of electrodes 330 will engage a circuit board conducting finger 101 along the centerline thereof.

Referring again to FIG. 1 of the drawing, probe beam 31 carries a terminal block 40 arranged to mount a plurality of electrode terminals 400 intended for use in interconnecting each pair of electrodes 330 with electrical resistance measuring circuitry 50. Terminals 400 are grouped in pairs of terminals such that each terminal pair is associated with one electrode 330 and two terminal pairs are associated with one pair of electrodes 330 mounted in a probe assembly 33. Terminal block 40 is constructed of insulating material and in the embodiment of the invention is mounted either by screws or by any of a number of well-known means in a channel formed in the upper surface of probe beam 31 parallel to the row of mounting receptacles utilized to hold probe assemblies 33. Each terminal 400 is molded in terminal block 40 and extends therefrom so that one end may be coupled to a terminal of terminal block 41 located on base member 10 and the other end coupled with either conductor 401 connected to electrode needle member 3300, FIG. 4, or conductor 402 connected to electrode contact member 3301. Terminal block 40 may also be used to retain probe assembly 33 within probe beam 31 or probe assembly 33 may either be press fitted into probe beam 31 or mounted thereon by machine screws.

As set forth in FIG. 1, terminals 400 of terminal block 40 are connected to terminals of terminal block 41 which in turn are connected to switch apparatus 42. In the embodiment of the invention, switch apparatus 42 is assumed to be a relay type scanner wherein the sequential operation of relays 421, 422 and 423 closes their respective contacts to selectively couple four leads associated with a pair of probe assembly electrodes 330 to electrical resistance measuring circuitry 50. Although relay switching type of scanner apparatus is disclosed, it is to be understood that other types of scanner apparatus well known in the art may be used to connect four electrode conductors with electrical resistance measuring circuitry 50. For example, a crossbar switch or electronic logic apparatus, both of which are well known in the art, may be used for this purpose.

Switch apparatus 42 is coupled by four conductors 461, 462, 463, and 464 to electrical resistance measuring circuitry 50 comprising a constant current source 501 and voltage measuring device 502.

Circuit board testing apparatus 1 also comprises a controller 43 used for controlling the sequence of testing each conducting finger 101 of circuit board 100. Controller 43 may be one of a general class of well-known stored program processors or wired logic type of controllers both of which are well known in the art and each of which is capable of operating switch apparatus 42 to sequentially scan each pair of electrodes 330 and to selectively couple a pair of electrodes 330 with voltage measuring device 502 and constant current source 501. In addition to controlling switch apparatus 42 and electrical resistance measuring circuitry 50, controller 43 may also include an arithmetic unit wherein the numerical value of voltage recorded by voltage measuring device 502 may be divided in the well-known manner by the value of the current generated by constant current source 501 to determine a value of resistance which may be displayed, printed, or used to indicate rejection when the value of measured resistance of a circuit board conducting finger exceeds a predetermined value.

Circuit board testing apparatus 1 also includes operating apparatus such as a handle device 21 pivotally mounted by pin 211 to yoke member 23 and by drag link 22 and pins 203, 210 to a rear clevis 201 of mounting member 20. Operation of handle device 21 enables circuit board 100 to be clamped to block assembly 11 and each probe assembly 33 positioned to engage a pair of electrodes 330 with a corresponding circuit board conducting finger 101. Although a handle 21 suitable for manual operation is illustrated in the drawing, it is to be understood that other apparatus, for example, a geared or hydraulic member operated in accordance with movement of a production line, could be used to operate yoke member 23 to thereby securely hold circuit board 100 and move pairs of electrodes 330 into and out of engagement with circuit board conducting fingers 101.

2. Apparatus Operation

Figure 2:
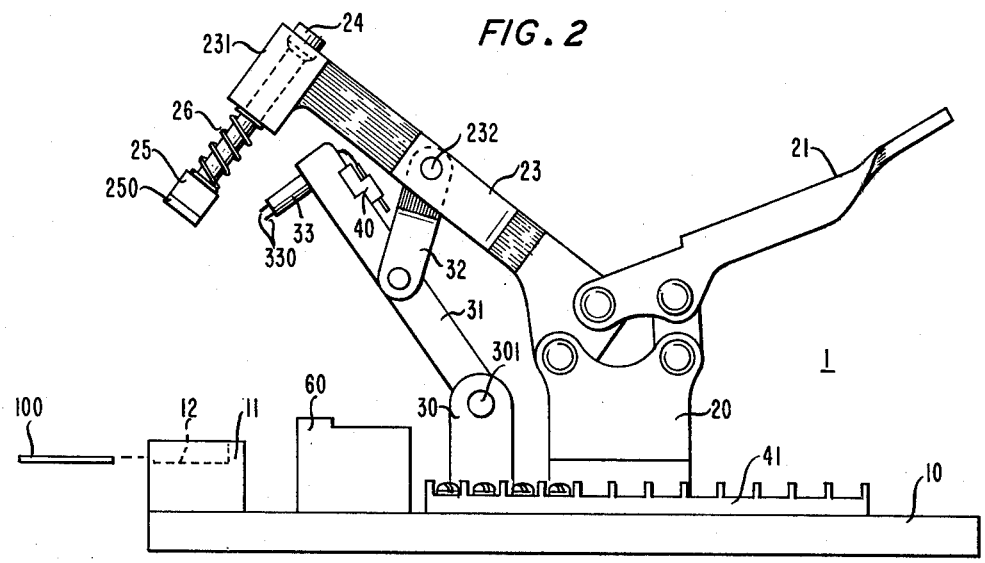
FIG. 2 is a side view of the circuit board testing apparatus illustrating the position of the apparatus for receiving a circuit board prior to engaging and testing the circuit board conducting fingers.

FIG. 2 of the drawing illustrates circuit board testing apparatus 1 in position prior to receiving and testing circuit board 100. Handle 21 has been operated to position yoke member 23 to raise both hold down bar 25 and probe beam 31 pivotally coupled by yoke link 32 to yoke member 23. In initiating the test sequence, circuit board 100 is moved and guided into position in nest 12 of block assembly 11 in order that each circuit board conducting finger 101 is aligned with a corresponding pair of electrodes 330 mounted in probe assembly 33. Handle 21 is then operated to rotate yoke member 23, FIG. 3, and move hold down bar 25 into engagement with circuit board 100. Engagement of hold down bar 25 with circuit board 100 moves bolts 24 through yoke arms 230 and 231 to compress spring members 26 and thereby bias hold down bar 25 to securely hold circuit board 100 in block assembly 11.

Figure 3:
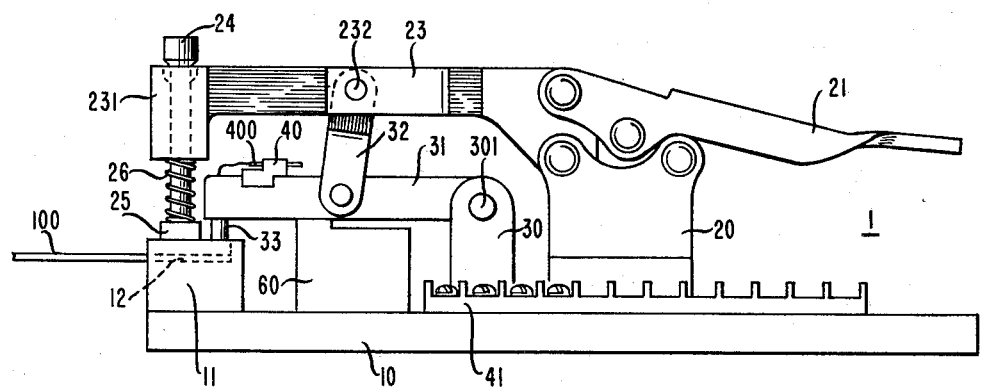
FIG. 3 is a side view of the circuit board testing apparatus illustrating the use of the apparatus to test the conducting fingers of a circuit board for presence of contamination films and foreign materials.
Figure 5:
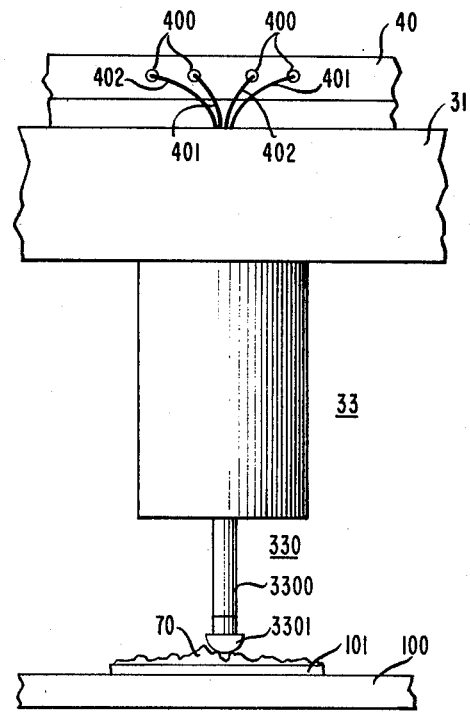
FIG. 5 is a fragmentary end view of the circuit board testing apparatus illustrating the probe and electrode assembly in engagement with a circuit board conducting finger.

Rotational movement of yoke member 23 also causes probe beam 31 to pivotally move about clevises 30 and thereby position probe assemblies 33, FIG. 5, to simultaneously engage each pair of electrodes 330 with one of the circuit board conducting fingers 101. Stop 60, located on base member 10, FIGS. 2 and 3, is provided to restrict the downward movement of probe beam 31 and thereby prevent damage from occurring to electrodes 330 and circuit board conducting fingers 101. As set forth in FIGS. 4 and 5 of the drawing, each probe assembly 33 aligns a pair of electrodes 330 generally along a centerline of a circuit board conducting finger 101. Highly compliant spring members 333 bias each electrode collar 3302 to maintain an electrode contact member 3301 in engagement with a conducting finger 101.

After circuit board 100 has been secured to block assembly 11 and pairs of electrodes 330 positioned to engage circuit board conducting fingers 101, controller 43, FIG. 1, selectively operates switch apparatus relay 421 to couple electrical resistance measuring circuitry 50 with one pair of electrodes 330. Current then flows over a path from constant current source 501 over conductor 461, through operated switch apparatus relay contacts 421-1 and over conductors 441 and 451 to a first terminal 400 mounted in terminal block 40. The current flow continues along a path, FIGS. 4 and 5, over electrode needle conductor 401, for example, conductor 401 connected to the right electrode 330 of FIG. 4, through the right electrode needle member 3300 and associated gold alloy contact member 3301, any contamination film or foreign material 70, circuit board conducting finger 101, the left gold alloy contact member 3301, associated needle member 3300 and electrode needle conductor 401 to a second terminal 400 coupled to conductor 454. Current flow continues, FIG. 1, along the path over conductors 454 and 444 through operated switch apparatus relay contacts 421-4 and conductor 464 to constant current source 501.

In addition, controller 43 selectively couples voltage measuring device 502 to a pair of electrodes 330 by a path extending over conductors 462, 463, through operated switch apparatus relay contacts 421-2, 421-3, conductors 442, 443, and 452, 453, a pair of third and fourth terminals 400, and connected conductors 402, FIGS. 4 and 5, extending through left and right electrode needle members 3300 to gold alloy contact members 3301 affixed thereto. Since a known and constant value of current flows from one electrode needle member 3300 and associated contact member 3301 through a circuit board conducting finger 101 to another electrode contact member 3301 and associated needle member 3300, the value of the resultant voltage drop appearing across a pair of electrode contact members 3301 and measured by voltage measuring device 502, FIG. 1, is determinative of the electrical resistance of circuit board conducting finger 101. A contamination film or foreign material 70, inadvertently appearing on a conducting finger 101, increases the resistance offered to the flow of current and therefore causes a larger voltage drop to occur between the pair of electrode contact members 3301. The resulting higher voltage measured by voltage measuring device 502 indicates the presence of a contamination film or foreign material that may be present on a circuit board conducting finger 101 and which may, if not corrected or removed, cause circuit board 100 to fail when placed in service.

In the embodiment of the invention, constant current source 501 is assumed to generate a constant value of current. However, the relationship between voltage, current, and resistance has been well established and it is possible that different values of generated current and the resulting measured voltages could be transmitted over conductors of cable 5043 to controller 43 wherein well-known mathematical logic circuitry could be provided to obtain the conducting finger resistance by dividing measured voltages by values of generated current.

When electrical resistance measuring apparatus 50 has measured the resistance of a first circuit board conducting finger, controller 43 releases switch apparatus relay 421 and operates relay 422. Operation of switch apparatus relay 422 couples another pair of electrodes 330 to constant current supply 501 and voltage measuring device 502 in order that the resistance of another conducting finger 101 can be measured. Controller 43 sequentially operates relays 421, 422, and 423 of switch apparatus 42 until each conducting finger 101 of circuit board 100 has been measured. If the test indicates the presence of a contamination film or foreign material on a conducting finger 101, circuit board 100 may be subsequently repaired before shipping. When the test sequence indicates that the measured resistance of each conducting finger 101 is less than a predetermined value of resistance, the tested circuit board 100 is considered to have passed the test and is removed from testing apparatus 1 in order that other circuit boards may be similarly tested.

After completion of the testing sequence, FIG. 1, handle 21 is operated to pivotally rotate yoke member 23 upwards. Upward movement of yoke member 23 disengages hold down bar 25 from the surface of circuit board 100 and causes mechanically coupled probe beam 31 to disengage each pair of electrodes 330 from the circuit board conducting fingers 101. The released circuit board 100 may then be removed from nest 12 of block assembly 11 and circuit board testing apparatus 1 is again ready to test another circuit board.

SUMMARY

It is obvious from the foregoing that the facility, economy, and efficiency of testing circuit boards may be substantially enhanced by testing apparatus arranged to test the conducting fingers of a circuit board. It is further obvious from the foregoing that circuit board testing apparatus having a pair of electrodes corresponding to each circuit board conducting finger and which is arranged to simultaneously engage each circuit board conducting finger with an electrode pair that is selectively connected to electrical measuring circuitry arranged to measure the resistance appearing between each electrode of the electrode pair facilitates the manufacturing and testing of circuit boards to detect circuit board conducting finger contamination.

What is claimed is:

1. Apparatus for testing circuit boards (100), said apparatus having circuitry (50) for measuring electrical resistance, and testing apparatus (1) for coupling said measuring circuitry to conducting fingers (101) of a circuit board

CHARACTERIZED IN THAT said testing apparatus comprises a probe assembly (33) having electrodes (330) corresponding to each of the circuit board conducting fingers, said electrodes each comprising a needle member and a contact member, guide apparatus (11) for receiving and holding the circuit board, positioning apparatus (20, 21, 23, 24, 25, 26, 30, 31, 32) for securing the circuit board to said guide apparatus and for positioning said probe assembly to simultaneously engage said contact members of a pair of said electrodes with each circuit board conducting finger, and coupling apparatus (40, 42, 43, 44-, 45-, 46-, 400, 401, 402) for sequentially connecting said needle members and said contact members of each of said pair of engaged electrodes with said measuring circuitry to measure the resistance of a contamination film and foreign material appearing on a conducting finger between said contact members of said engaged pair of electrodes.

2. The circuit board testing apparatus of claim 1 CHARACTERIZED IN THAT
said probe assembly comprises
a pair of electrodes (330),
plug apparatus (331, 332) for resiliently mounting pairs of said electrodes on said positioning apparatus, and
compliant spring members (333) for biasing said electrode contact members in engagement with the circuit board conducting fingers.

3. The circuit board testing apparatus of claim 2 CHARACTERIZED IN THAT
said guide apparatus comprises
a block assembly (11) arranged for receiving the circuit board and for aligning each conducting finger of the circuit board with respect to corresponding pairs of said electrodes.

4. The circuit board testing apparatus of claim 3 CHARACTERIZED IN THAT
said positioning apparatus comprises
resiliently biased apparatus (24, 25, 26) for retaining the circuit board in fixed relationship to said block assembly,
carrier apparatus (30, 31) for securely holding said plug apparatus and for moving said electrode pairs in and out of engagement with the circuit board conducting fingers, and
operating apparatus (20, 21, 22, 23, 32) coupled to said resiliently biased apparatus and to said carrier apparatus for enabling said resiliently biased apparatus to clamp the circuit board to said guide apparatus and for enabling said carrier apparatus to move said electrode pairs into engagement with the circuit board conducting fingers.

5. The circuit board testing apparatus of claim 4 CHARACTERIZED IN THAT
said coupling apparatus comprises
a pair of terminals (400) for each of said electrodes,
terminal mounting apparatus (40) for mounting said terminals on said carrier apparatus in fixed relationship to said electrode pairs,
wiring apparatus (401, 402) for connecting said terminal pairs with said electrodes, and
selectively coupling apparatus (42, 43, 44-, 45-, 46-) for sequentially connecting ones of said terminal pairs to said measuring circuitry.

6. The circuit board testing apparatus of claim 5 in which
said measuring circuitry comprises a voltage measuring device (502) and a current supply (501) CHARACTERIZED IN THAT
said selectively coupling apparatus comprises
a controller (43), and
switch apparatus (42) controlled by said controller for selectively coupling the voltage measuring device and the current supply to said pairs of electrodes.

7. The circuit board testing apparatus of claim 6 CHARACTERIZED IN THAT
said wiring apparatus comprises
a first pair of conductors (401, 402) for connecting one electrode of said electrode pairs to a first pair of said terminals, and
a second pair of conductors (401, 402) for connecting another electrode of said electrode pairs to a second pair of said terminals.

8. The circuit board testing apparatus of claim 7 CHARACTERIZED IN THAT
each of said electrodes comprises
a needle member (3300) having an axial bore sized for receiving a first conductor and having a land on one end thereof for terminating a second conductor of one of said conductor pairs,
a contact member (3301) terminating said first conductor and affixed to an end of said needle member opposite said land end thereof for engaging a circuit board conducting finger, and
a collar member (3302) affixed to said needle member for restricting movement of said electrode in said plug apparatus.

9. The circuit board testing apparatus of claim 8 CHARACTERIZED IN THAT
said plug apparatus comprises
a plug assembly (331, 332) holding said collar member in a fixed relationship to said compliant spring member for mounting said pair of electrodes so that each electrode contact member may be positioned a distance apart along a centerline of a conducting finger and biased in engagement with the circuit board conducting finger.

10. Apparatus for testing circuit boards (100), said apparatus having
circuitry (50) for measuring electrical resistance, and
test apparatus (1) for coupling said measuring circuitry to conducting fingers (101) of a circuit board CHARACTERIZED IN THAT
said testing apparatus comprises
a plurality of electrodes (330),
a probe assembly (33) for resiliently mounting a pair of said electrodes,
a block assembly (11) for receiving a circuit board and for aligning a conducting finger of the circuit board with said probe assembly,
resiliently biased retaining apparatus (24, 25, 26) for securely holding the circuit board in said block assembly,
carrier apparatus (30, 31) for securely holding said probe assembly,
operating apparatus (20, 21, 22, 23, 32) coupled to said resiliently biased retaining apparatus and said carrier apparatus for enabling said resiliently biased retaining apparatus to clamp the circuit board to said block assembly and for enabling said carrier apparatus to move said pair of electrodes into engagement with the circuit board conducting finger,
coupling apparatus (40, 42, 43, 44-, 45-, 46-, 400, 401, 402) for selectively connecting said pair of engaged electrodes with said measuring circuitry to measure the resistance of contamination films and foreign material appearing on the conducting finger between said pair of electrodes.

11. The circuit board testing apparatus of claim 10 CHARACTERIZED IN THAT
said probe assembly comprises
a plug assembly (331, 332, 333) for spring mounting said pair of electrodes on said carrier apparatus in a spaced-apart relationship along a centerline of a corresponding circuit board conducting finger.

12. The circuit board testing apparatus of claim 10 CHARACTERIZED IN THAT
said coupling apparatus comprises
a pair of first conductors (401) each coupled to one electrode of said pair of electrodes,
a pair of second conductors (402) each coupled to one electrode of said pair of electrodes,
switch apparatus (42) coupled to said first and second conductors for coupling said pair of electrodes to said measuring circuitry, and
control apparatus (43) for controlling said switch apparatus to select said pair of electrodes.

13. The circuit board testing apparatus of claim 12 CHARACTERIZED IN THAT
each of said electrodes comprises
a needle member (3300) having an axial bore sized for receiving one of said first conductors and having a land on one end thereof for terminating one of said second conductors, and
a contact member (3301) terminating said one first conductor and affixed to an end of said needle member opposite said land end thereof.

14. The circuit board testing apparatus of claim 13 in which
said measuring circuitry comprises a voltage measuring device (502) and a current supply (501).
CHARACTERIZED IN THAT
said switch apparatus comprises selectively coupling apparatus (421, 422, 423) controlled by said control apparatus for selectively connecting said current supply with said pair of first conductors and said voltage measuring device to said pair of second conductors.

15. Apparatus for testing circuit boards (100), said apparatus having
a constant current source (501),
a voltage measuring device (502), and
testing apparatus (1) for coupling said constant current source and said voltage measuring device to conducting fingers (101) of a circuit board
CHARACTERIZED IN THAT
said testing apparatus comprises
a plurality of electrodes (330) each of said electrodes having a needle member (3300) and a contact member (3301) affixed to an end of said needle member,
plug apparatus (331, 332, 333) for resiliently mounting pairs of said electrodes,
guide apparatus (11) for receiving a circuit board and for aligning each conducting finger of the circuit board with respect to a corresponding pair of said electrodes,
resiliently biased apparatus (24, 25, 26) for retaining the circuit board in a fixed relationship to said guide apparatus,
carrier apparatus (30, 31) for securely holding said plug apparatus and for moving pairs of said electrodes into and out of engagement with the circuit board conducting fingers,
operating apparatus (20, 21, 22, 23, 32) coupled to said resiliently biased apparatus and to said carrier apparatus for enabling said resiliently biased apparatus to clamp the circuit board to said guide apparatus and for enabling said carrier apparatus to simultaneously move said electrode contact members into engagement with the circuit board conducting fingers,
controller apparatus (43) for selecting ones of said pairs of contacts, and
coupling apparatus (40, 42, 44-, 45-, 46-, 400, 401, 402) coupled to said pairs of electrodes and controlled by said controller apparatus for selectively coupling said voltage measuring device to said electrode contact members and said constant current source to said electrode needle members to measure the resistance of contamination films and foreign matter appearing on the conducting fingers between a pair of said electrodes.

16. Apparatus for testing conducting fingers of a circuit board, said apparatus comprising
a plurality of electrodes each having a needle member and a contact member,
means for receiving and holding the circuit board,
means for mounting pairs of said electrodes,
means for positioning said mounting means to simultaneously engage said contact members of a pair of said electrodes with each circuit board conducting finger,
means for measuring electrical resistance, and
means for selectively connecting said electrical resistance measuring means to both said needle members and said contact members of each engaged pair of said electrodes to measure the resistance of contamination films and foreign material appearing on a circuit board conducting finger between said pair of electrode contact members.

17. A method of testing a circuit board with test apparatus comprising a probe assembly having electrodes comprised of a needle member and a contact member corresponding to each circuit board conducting finger, guide apparatus for receiving a circuit board, and electrical resistance measuring means, said method comprising the steps of
receiving and securing a circuit board to the guide apparatus,
positioning the probe assembly with respect to said secured circuit board to simultaneously engage the contact members of a pair of the electrodes with each circuit board conducting finger, and
selectively coupling the electrical resistance measuring means to the needle members and the contact members of each pair of said engaged electrodes to detect the presence and measure contamination films and foreign material appearing on a circuit board conducting finger between the contact members of an engaged pair of electrodes.

* * * * *